(12) United States Patent
Huang et al.

(10) Patent No.: US 11,189,717 B2
(45) Date of Patent: Nov. 30, 2021

(54) STEEP SLOPE TRANSISTORS WITH THRESHOLD SWITCHING DEVICES

(71) Applicants: Xuanqi Huang, Tempe, AZ (US); Yuji Zhao, Chandler, AZ (US); Runchen Fang, Milpitas, CA (US); Hugh Barnaby, Tempe, AZ (US)

(72) Inventors: Xuanqi Huang, Tempe, AZ (US); Yuji Zhao, Chandler, AZ (US); Runchen Fang, Milpitas, CA (US); Hugh Barnaby, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 4 days.

(21) Appl. No.: 16/739,333

(22) Filed: Jan. 10, 2020

(65) Prior Publication Data
US 2020/0227546 A1   Jul. 16, 2020

Related U.S. Application Data

(60) Provisional application No. 62/790,937, filed on Jan. 10, 2019.

(51) Int. Cl.
| | |
|---|---|
| *H01L 29/778* | (2006.01) |
| *H01L 29/08* | (2006.01) |
| *H01L 27/24* | (2006.01) |
| *H01L 29/20* | (2006.01) |
| *H01L 45/00* | (2006.01) |

(Continued)

(52) U.S. Cl.
CPC .......... *H01L 29/7786* (2013.01); *H01L 27/24* (2013.01); *H01L 29/0847* (2013.01); *H01L 29/2003* (2013.01); *H01L 29/205* (2013.01); *H01L 29/66462* (2013.01);
(Continued)

(58) Field of Classification Search
None
See application file for complete search history.

(56) References Cited

U.S. PATENT DOCUMENTS 10,700,218 B2   6/2020   Zhao et al.
2018/0366591 A1*  12/2018   Song .................. H01L 45/1266
(Continued)

OTHER PUBLICATIONS

Saito, W. "Recessed-Gate Structure Approach Toward Normally Off High-Voltage AlGaN/GaN HEMT for Power Electronics Applications" IEEE Trans. on Elec Dev. vol. 53, No. 2 Jan. 23, 2006 pp. 356-362 (Year: 2006).*

(Continued)

*Primary Examiner* — Grant S Withers
(74) *Attorney, Agent, or Firm* — Fish & Richardson P.C.

(57) ABSTRACT

A steep-slope (SS) field effect transistor (FET) including a FET having a source region and a drain region, and a threshold switching device in direct contact with the source region or the drain region of the FET. Fabricating the steep-slope (SS) field effect transistor (FET) includes fabricating an AlGaN/GaN metal-insulator-semiconductor high electron mobility transistor (MIS-HEMT) having a source region and a drain region, depositing a first electrode layer directly on the source region or the drain region, depositing a threshold switching layer directly on the first electrode layer, and depositing a second electrode layer directly on the threshold switching layer.

17 Claims, 2 Drawing Sheets

(51) Int. Cl.
  *H01L 29/66* (2006.01)
  *H01L 29/205* (2006.01)
(52) U.S. Cl.
  CPC ...... *H01L 29/7787* (2013.01); *H01L 45/1253* (2013.01); *H01L 45/145* (2013.01); *H01L 45/1608* (2013.01)

(56) References Cited

U.S. PATENT DOCUMENTS

| | | | |
|---|---|---|---|
| 2019/0252465 A1* | 8/2019 | Frougier | ......... H01L 21/823821 |
| 2019/0305045 A1* | 10/2019 | Sharma | ............. H01L 29/78684 |
| 2020/0144328 A1 | 5/2020 | Fu et al. | |

OTHER PUBLICATIONS

U.S. Appl. No. 16/818,659, Montes et al., filed Mar. 13, 2020.
U.S. Appl. No. 16/811,355, Huang et al., filed Mar. 6, 2020.
Alamo et al., "Nanometre-scale electronics with III-V compound semiconductors," Nature, Nov. 17, 2011, 479:317-323.
Chen et al., "A CMOS-compatible electronic synapse device based on Cu/SiO$_2$/W programmable metallization cells," Nanotechnology, May 12, 2016, 27(255202), 9 pages.
Chen et al., "A Study of Gamma-Ray Exposure of Cu—SiO$_2$ Programmable Metallization Cell," IEEE Trans. Nucl. Sci., Dec. 6, 2015, 62(6):2404 2411.
Chen et al., "Impedance Spectroscopy of Programmable Metallization Cells With a Thin SiO$_2$ switching Layer," IEEE Electron Device Lett., May 5, 2016, 37(5):576-579.
Chen et al., "SiO$_2$ based conductive bridging random access memory," J. Electroceramics, Mar. 15, 2017, 39:109-131.
Chen et al., "Characterizations of nonlinear optical properties on GaN crystals in polar, nonpolar, and semipolar orientations," Appl. Phys. Lett., May 3, 2017, 110(181110), 4 pages.
Chen et al., "Low loss GaN waveguides at the visible spectral wavelengths for integrated photonics applications," Opt. Express, Dec. 11, 2017, 25(25), 16 pages.
Choi et al., "SiGe epitaxial memory for neuromorphic computing with reproducible high performance based on engineered dislocations," Nat. Mater., Apr. 2018, 17:335-340.
Clinton et al. "Negative differential resistance in GaN homojunction tunnel diodes and low voltage loss tunnel contacts," Appl. Phys. Lett., 112(252103), 5 pages.
Fu et al., "Investigation of GaN-on-GaN vertical p-n diode with regrown p-GaN by metalorganic chemical vapor deposition," Appl. Phys. Lett., Dec. 3, 2018, 113(233502), 4 pages.
Fu et al., "Nonpolar vertical GaN-on-GaN p-n diodes grown on free-standing (1010) m-plane GaN substrates," Appl. Phys. Express Oct. 16, 2018, 11(111003), 5 pages.
Fu et al., "Effect of Buffer Layer Design on Vertical GaN-on-GaN p-n and Schottky Power Diodes," IEEE Electron Device Lett., Jun. 2017, 38(6):763-766.
Fu et al., "High Performance Vertical GaN-on-GaN p-n Power Diodes With Hydrogen-Plasma-Based Edge Termination," IEEE Electron Device Lett., Jul. 2018, 39(7):1018-1021.
Fu et al., "Theoretical analysis of modulation doping effects on intersubband transition properties of semipolar AlGaN/GaN quantum well," J. Appl. Phys., Jan. 3, 2017, J. Appl.Phys., 121(014501), 9 pages.
Fu et al., "Ultra-low turn-on voltage and on-resistance vertical GaN-on-GaN Schottky power diodes with high mobility double drift layers." Appl. Phys. Lett., Oct. 9, 2017, 111(152102), 5 pages.
Hruska [online], "Intel Won't Have 10nm CPUs Ready Until the End of 2019," ExtremeTech, Jul. 30, 2018, retrieved from URL <https://www.extremetech.com/computing/274373-intel-wont-have-10nm-cpus-ready-until-the-end-of-2019>, 4 pages.
Hua et al., "Integration of LPCVD-SiN$_x$gate dielectric with recessed-gate E-mode GaN MIS-FETs: Toward high performance, high stability and long TDDB lifetime." IEEE International Electron Devices Meeting (IEDM), 2016:10.4.1-10.4.4, 4 pages.

Huang et al. "A novel Si tunnel FET with 36mV/dec subthreshold slope based on junction depleted-modulation through striped gate configuration," International Electron Devices Meeting, 2012:8.5.1-8.5.4, 4 pages.
Huang et al. "Nonpolar and semipolar InGaN/GaN multiple-quantum-well solar cells with improved carrier collection efficiency," Appl. Phys. Lett., Apr. 2017, 110(161105), 5 pages.
Huang, "Energy band engineering of InGaN/GaN multi-quantum-well solar cells via AlGaN electron- and hole-blocking layers." Appl. Phys. Lett., Jul. 2018, 113(043501), 5 pages.
Kong et al., "Ambipolar field effect in the ternary topological insulator $(Bi_xSb_{1-x})_2Te_3$ by composition tuning," Nat. Nanotechnol., Oct. 2, 2011, 6:705-709.
Lim et al., "Excellent threshold switching device (Ioff ~ 1 pA) with atom-scale metal filament for steep slope (< 5 mV/dec), ultra low voltage (Vdd=0.25 V) FET applications," IEEE International Electron Devices Meeting (IEDM), 2016:34.7.1-37.7.4, 4 pages.
Liu et al., "3-inch GaN-on-Diamond HEMTs With Device-First Transfer Technology." IEEE Electron Device Lett., Oct. 2017, 38(10):1417-1420.
Lübben et al., "SET kinetics of electrochemical metallization cells: influence of counter-electrodes in SiO$_2$ /Ag based systems." Nanotechnology, Mar. 1, 2017, 28(135205), 6 pages.
Mehonic et al., "Silicon Oxide (SiO$_x$): A Promising Material for Resistance Switching?" Adv. Mater., 2018, 30(1801187), 21 pages.
Meindl et al. "Limits on Silicon Nanoelectronics for Terascale Integration," Science, Sep. 14, 2001, 293(5537):2044-2049.
Park et al., "NbO$_2$ based threshold switch device with high operating temperature ( >85° C.) for steep-slope MOSFET ( ~2mV/dec) with ultra-low voltage operation and improved delay time," IEEE International Electron Devices Meeting (IEDM), 2017:23.7.1-23.7.4, 4 pages.
Radisavljevicet al., "Single-layer MoS$_2$ transistors," Nat. Nanotechnol., Jan. 30, 2011, 6:147-150.
Salahuddin et al., "Use of Negative Capacitance to Provide Voltage Amplification for Low Power Nanoscale Devices," Nano Letters, 2008, 8(2):405-410.
Shilov et al. [online], "GlobalFoundries Stops All 7nm Development: Opts To Focus on Specialized Processes," Anandtech, Aug. 27, 2018, retrieved from URL <https://www.anandtech.com/show/13277/globalfoundries-stops-all-7nm-development>, 7 pages.
Shukla et al., "A steep-slope transistor based on abrupt electronic phase transition," Nat. Commun., Aug. 7, 2015, 6(7812), 6 pages.
Song et al., "Threshold Selector With High Selectivity and Steep Slope for Cross-Point Memory Array," IEEE Electron Device Lett., Jul. 7, 2015, 36(7):681-683.
Song et al.. "Monolithic integration of AgTe/TiO$_2$ based threshold switching device with TiN liner for steep slope field-effect transistors," IEEE International Electron Devices Meeting (IEDM), 2016:25.3.1-25.3.4, 4 pages.
Sun et al., "Graded-Index Separate Confinement Heterostructure AlGaN Nanowires: Toward Ultraviolet Laser Diodes Implementation," ACS Photonics, Aug. 2018, 5(8):3305-3314.
Sun et al.. "Room-temperature continuous-wave electrically pumped InGaN/GaN quantum well blue laser diode directly grown on Si," Light Sci. Appl., Dec. 2018, 7(13), 7 pages.
Tappertzhofen et al., "Redox processes in silicon dioxide thin films using copper microelectrodes," Appl. Phys. Lett., Nov. 14, 2011, 99(203103), 3 pages.
Tian et al., "A Graphene-Based Filament Transistor with Sub-10 mVdec—1 Subthreshold Swing," Adv. Electron. Mater. , 2018, 4(1700608), 7 pages.
Valov et al., "Electrochemical metallization memories—fundamentals, applications, prospects," Nanotechnology, Jun. 6, 2011, 22(289502), 23 pages.
Verma et al.. "Steep Sub-Boltzmann Switching in AlGaN/GaN Phase-FETs With ALD VO$_2$," IEEE Trans. Electron Devices, Mar. 2018, 65(3):945-949.
Wu et al., "Toward Understanding Positive Bias Temperature Instability in Fully Recessed-Gate GaN MISFETs," IEEE Transactions Electron Devices, May 2016, 63(5)1853-1860.
Wu et al., "Very-high power density AlGaN/GaN HEMTs," IEEE Transactions Electron Devices, Mar. 2001, 48(3):586-590.

(56) References Cited

OTHER PUBLICATIONS

Xiong et al., "Integrated GaN photonic circuits on silicon (100) for second harmonic generation," Opt. Express, May 12, 2011, 19(11):10462-10470.
Zhang et al., "AlGaN/GaN MIS-HEMTs of Very-Low Vth Hysteresis and Current Collapse With In-Situ Pre-Deposition Plasma Nitridation and LPCVD-$Si_3N_4$ Gate Insulator," IEEE Electron Device Letters, Dec. 2016, 38(2):236-239.
Zhang et al.. "Fabrication of normally-off AlGaN/GaN metal-insulator-semiconductor high-electron-mobility transistors by photo-electrochemical gate recess etching in ionic liquid," Appl. Phys. Express, Jul. 25, 2016, 9(084102), 3 pages.
Zhang et al., "Studies on High-Voltage GaN-on-Si MIS-HEMTs Using LPCVD $Si_3N_4$ as Gate Dielectric and Passivation Layer," IEEE Transactions Electron Devices, Feb. 2016, 63(2):731-738.
Zhang et al., "Normally Off AlGaN/GaN MIS-High-Electron Mobility Transistors Fabricated by Using Low Pressure Chemical Vapor Deposition $Si_3N_4$ Gate Dielectric and Standard Fluorine Ion Implantation," IEEE Electron Device Letters, Nov. 2015, 36(11):1128-1131.
Zhao et al., "Toward ultimate efficiency: progress and prospects on planar and 3D nanostructured nonpolar and semipolar InGaN light-emitting diodes," Adv. Opt. Photonics, Mar. 2018, 10(1):246-308.
Zheng et al.. "Analysis of MOCVD $SiN_x$ Passivated N-Polar GaN MIS-HEMTs on Sapphire With High $f_{max}$ VDSQ," IEEE Electron Device Letters, Mar. 2018, 39(3):409-412.

\* cited by examiner

STEEP SLOPE TRANSISTORS WITH THRESHOLD SWITCHING DEVICES

CROSS-REFERENCE TO RELATED APPLICATION

This application claims the benefit of U.S. Application No. 62/790,937 entitled "STEEP SLOPE TRANSISTORS WITH THRESHOLD SWITCHING DEVICES" filed on Jan. 10, 2019, which is incorporated by reference herein in its entirety.

STATEMENT OF GOVERNMENT INTEREST

This invention was made with government support under DE-AR0000868 awarded by the Department of Energy and under 80NSSC 17K0768 awarded by the National Aeronautical & Space Administration. The government has certain rights in the invention.

BACKGROUND

The continuance of Moore's law has become quite stringent for semiconductor foundries due to the limits of physics and fabrications. Meanwhile, conventional Si-based metal-oxide-semiconductor field-effect transistors (MOSFETs) are facing the fundamental limitation of the subthreshold swing (SS) by Boltzmann's theory. To keep providing faster computing systems for customers in future generation electronics, innovative materials and technologies, including III-V compounds, two-dimensional (2D) materials, topological insulators, and neural networks have been explored extensively. However, improving average SS, repeatability, and homogeneity of these devices remains a critical challenge. Other challenges include thermal instability in high frequency applications.

SUMMARY

A steep-slope field-effect transistor with an AlGaN/GaN metal-insulator-semiconductor high electron mobility transistor (MIS-HEMT) employing $SiO_2$-based threshold switching devices in series with the source is disclosed. The $SiO_2$-based threshold switching devices exhibit a steep slope when changing resistance states. The integrated steep-slope transistor shows a low subthreshold swing of sub-5 mV/dec with a transition range of over $10^5$ in the transfer characteristics in both sweep directions at room temperature, as well as the low leakage current ($10^{-5}$ µA/µm) and a high $I_{ON}/I_{OFF}$ ratio (>$10^7$). Moreover, with the $SiO_2$-based threshold switching devices, the threshold voltages ($V_{th}$) were found to be significantly improved. Results from more than 50 times transfer characteristics measurements also indicate that the average steep slopes are below 10 mV/decade. This steep-slope transistor with oxide-based threshold switching devices can extend to various transistor platforms (e.g., Si and III-V) and are suitable for power switching and high frequency devices. Compared to Mott insulators, $SiO_2$-based resistive random-access memory (RRAM) is favored due at least in part to compatibility in the back-end-of-line (BEOL) processing in integrated circuits foundries.

In a first general aspect, a steep-slope (SS) field effect transistor (FET) includes a FET comprising a source region and a drain region and a threshold switching device in direct contact with the source region or the drain region of the FET.

Implementations of the first general aspect may include one or more of the following features.

In some cases, the FET includes an AlGaN/GaN metal-insulator-semiconductor high electron mobility transistor (MIS-HEMT).

The threshold switching device has a metal-insulator-metal (MIM) structure including a first electrode, a second electrode, and a threshold switching layer between the first electrode and the second electrode. The first electrode may include titanium. The first electrode can be in direct contact with the source region or the drain region of the FET. The second electrode may include silver. The threshold switching layer includes $SiO_2$.

In certain cases, an abrupt transition from a high resistance state to a low resistance state occurs when an applied voltage reaches a threshold value. The abrupt transition typically results in a steep threshold slope.

The SS-FET typically has a subthreshold swing of about 5 mV/dec with a transition range of over $10^5$ in both sweep directions at room temperature. The SS-FET typically has a leakage current of $10^{-5}$ µA/µm or less, an on-to-off current ratio ($I_{ON}/I_{OFF}$) of greater than $10^7$, or both.

The FET includes Si, Ge, SiGe, or a binary or ternary compound semiconductor including elements from Groups II-VI, III-V, and IV-IV and Group III nitrides. In one example, the FET includes a silicon substrate, a GaN buffer layer on the Si substrate, a GaN channel layer on the GaN buffer layer, an AlN interlayer, a barrier layer comprising Al, Ga, and N, and a GaN cap layer.

In a second general aspect, fabricating a steep-slope (SS) field effect transistor (FET) includes fabricating an AlGaN/GaN metal-insulator-semiconductor high electron mobility transistor (MIS-HEMT) having a source region and a drain region, depositing a first electrode layer directly on the source region or the drain region, depositing a threshold switching layer directly on the first electrode layer, and depositing a second electrode layer directly on the threshold switching layer.

Implementations of the second general aspect may include one or more of the following features.

The first electrode layer may include titanium. The second electrode layer may include silver. The threshold switching layer typically includes $SiO_2$.

The details of one or more embodiments of the subject matter of this disclosure are set forth in the accompanying drawings and the description. Other features, aspects, and advantages of the subject matter will become apparent from the description, the drawings, and the claims.

DETAILED DESCRIPTION

Steep-slope (SS) AlGaN/GaN metal-insulator-semiconductor high electron mobility transistors (MIS-HEMTs) on Si substrates employing SiO$_2$-based threshold switching devices in series with the source are disclosed. The SiO$_2$-based threshold switching devices exhibit a steep slope when changing resistance states. These integrated SS-HEMT devices achieve a low subthreshold swing of ~5 mV/dec with a transition range of over $10^5$ in the transfer characteristics in both scan directions at room temperature (RT), as well as low leakage current (~$10^{-5}$ µA/µm) and a high $I_{ON}/I_{OFF}$ ratio (>$10^7$). The threshold voltage ($V_{th}$) was also improved significantly. This SS-HEMT also has low leakage current (~$10^{-5}$ µA/µm) and a high $I_{ON}/I_{OFF}$ ratio (>$10^7$). For at least these reasons, this transistor architecture is suitable for other transistor systems, as well as low-power switching and high frequency applications.

Figure 1A:
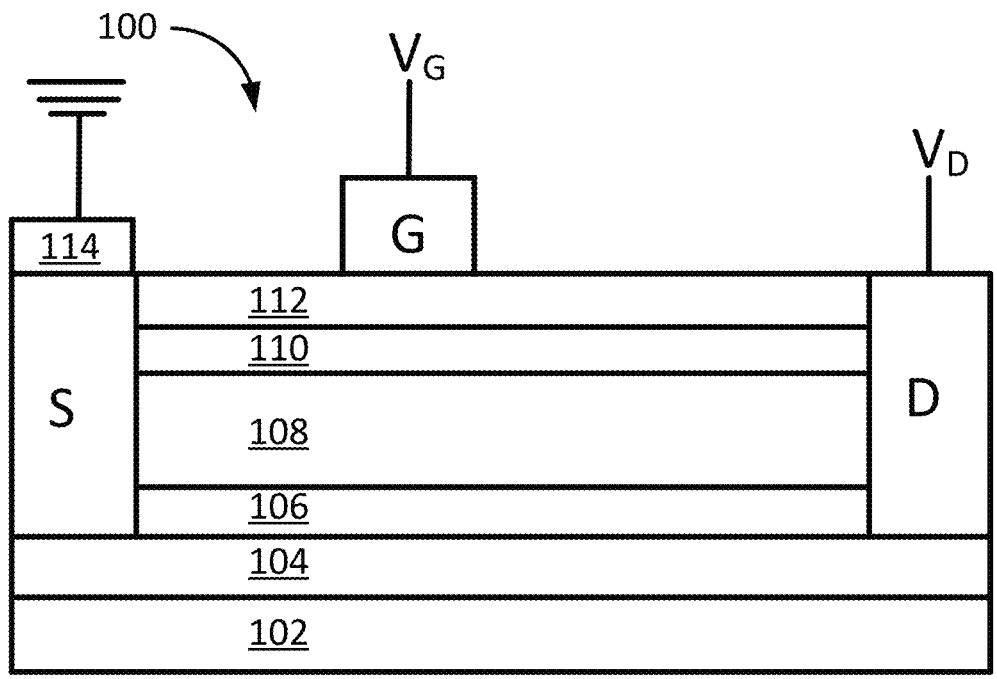
FIG. 1A is a schematic cross-sectional view of the steep-threshold-switching AlGaN metal-insulator-semiconductor high electron mobility transistor (MIS-HEMT).

AlGaN/GaN device epilayers for MIS-HEMTs can be grown by metalorganic chemical vapor deposition (MOCVD) on Si substrates. Suitable precursors for Ga and Al include trimethylgallium (TMGa) and trimethylaluminum (TMAl), respectively. Ammonia (NH$_3$) is a suitable source for N. Suitable carrier gases include, for example, H$_2$. As depicted in FIG. 1A, heterostructure 100 includes Si substrate 102, GaN buffer layer/channel layer 104, AlN interlayer 106, AlGaN barrier layer 108, GaN-cap layer 110, Si$_3$N$_4$ layer 112, and metal-insulator-metal (MIM) structure 114. Heterostructure 100 also includes source S, drain D, and gate G, as well as Si$_3$N$_4$ layer 112, grown by low-pressure chemical vapor deposition (LPCVD), can serve as a passivation layer and the gate dielectrics.

The AlGaN/GaN HEMTs can be fabricated using photolithography. The wafer is typically cleaned before metal deposition. Planar device isolation can be achieved by multi-energy fluorine-ion implantation. The LPCVD-Si$_3$N$_4$ in the source/drain contacting area can be etched away by reactive ion etching (RIE). Ohmic contacts for source and drain regions can be formed by e-beam evaporation of Ti/Al/Ni/Au and annealed (e.g., in N$_2$). Cate metals were deposited by e-beam evaporation with Ni/Au and a lift-off process. In one example, the gate-to-source space, the gate-to-drain space, the gate width, and the gate length are 4, 15, 100, and 4 m, respectively.

Figure 1B:
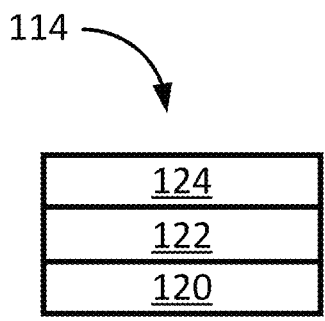
FIG. 1B is a schematic cross-sectional view of a metal-insulator-metal (MIM).

Threshold switching devices with MIM structure 114 are fabricated on the source contact of the MIS-HEMT, as shown in FIG. 1A. FIG. 1B shows MIM 114 structure including a Ti bottom electrode 120, SiO$_2$ switching layer 122, and Ag top electrode 124, sequentially deposited by e-beam evaporation without interrupting the vacuum. Each MIM cell is typically circular with a diameter of 10-50 m. Thermal annealing is typically not conducted afterwards.

Figure 1C:
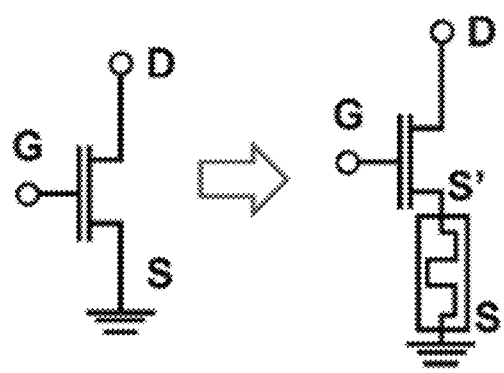
FIG. 1C shows schematic circuit diagrams of a stand-alone (left) and integrated steep-switching AlGaN MIS-HEMT device (right).

The threshold switching mechanisms can be understood with reference to FIG. 1C as follows: with the SiO$_2$ threshold switching device on the source of a HEMT, the original gate voltage $V_{GS}$ is composed of 2 parts: $V_{GS'}$ and $V_{SS}$. The $V_{SS}$ (<0V) is equal to the condition where the Ag electrode is applied a positive voltage, namely $V_{SS}$>0, since this is a depletion-mode HEMT and steep switching occurs at a negative $V_{GS}$.

EXAMPLE

The AlGaN/GaN device epilayers for the MIS-HEMTs were grown by metalorganic chemical vapor deposition (MOCVD) on 2-inch Si substrates. Trimethylgallium (TMGa) and trimethylaluminum (TMAl) were used as the precursors for Ga and Al, respectively, and ammonia (NH$_3$) was the source for N. The carrier gas was H$_2$. With reference to FIG. 1A, the heterostructure was formed as follows: a highly resistive GaN buffer layer grown on a Si substrate, a 100-nm GaN channel layer, a 1 nm AlN interlayer, a 28 nm Al$_{0.26}$Ga$_{0.74}$N barrier layer, and a 2 nm GaN-cap layer. A 20-nm Si$_3$N$_4$ layer grown by low-pressure chemical vapor deposition (LPCVD) serves as the gate dielectrics and a passivation layer. The LPCVD-grown Si$_3$N$_4$ layer was deposited at 780° C. with ammonia (NH$_3$) flow of 280 sccm, a SiH$_2$Cl$_2$ flow of 70 sccm, and a deposition rate of 3.5 nm/min.

The AlGaN/GaN HEMTs were fabricated using photolithography. The wafer was cleaned in acetone and isopropyl alcohol under ultrasonic, and then dipped briefly in hydrochloric acid before metal deposition. Planar device isolation was achieved by multi-energy fluorine-ion implantation. The LPCVD-Si$_3$N$_4$ in the source/drain contacting area was etched away by reactive ion etching (RIE). Ohmic contacts for source and drain regions were formed by e-beam evaporation of Ti/Al/Ni/Au (20/130/50/150 nm) and annealed at 890° C. for 30 s in N$_2$ (ambient). Then gate metals were deposited by e-beam evaporation with Ni/Au (50/150 nm) and lift-off process. The gate-to-source space, the gate-to-drain space, the gate width, and the gate length were 4, 15, 100, and 4 m, respectively. After MIS-HEMT fabrication, a 2-D electron gas density of ~$1\times10^{13}$ cm$^{-2}$ and electron Hall mobility of ~1800 cm$^2$/(V·s) were measured at room temperature.

Threshold switching devices with a MIM structure were then fabricated on the source contacts of the MIS-HEMT, as depicted in FIG. 1A. The MIM structure depicted in FIG. 1B comprised a 12 nm Ti bottom electrode (BE), a 12 nm SiO$_2$ switching layer, and a 15 nm Ag top electrode (TE), sequentially deposited by e-beam evaporation without interrupting the vacuum. Each MIM cell is circular with a diameter of 30 m. No thermal annealing was conducted afterwards. The final devices were denoted SS-HEMT. DC characterizations of oxide-based threshold switching devices were carried out using a Keithley 2400 sourcemeter, and transfer curves of the MIS-HEMTs and SS-HEMTs were performed using a Keithley 4200-SCS parameter analyzer. All measurements were performed at room temperature.

Representative resistive switching curves of the Ag/SiO$_2$/Ti oxide-based threshold switching devices were obtained at current compliances ($I_{CC}$) of 5 µA and 7.5 µA. For each current compliance, ~30 cycles were conducted to ensure the device repeatability and endurance. Threshold switching devices will go from a high resistance state (HRS) to a low resistance state (LRS) or "ON" state at a threshold voltage ($V_{th}$). For $I_{CC}$=7.5 µA, $V_{th}$ is ~3.7 V for positive scans and ~-1.8V for negative scans. In contrast for $I_{CC}$=5 µA, $V_{th}$ is ~3.2 V and ~-2.8V. In addition, the ON state switched back to OFF state when the voltage sweeps back to a low level (1.5V for $I_{CC}$=7.5 µA and 2.5V for $I_{CC}$=5 µA). The rectifying ratio of ~$10^2$ can be further enhanced with smaller MIM devices due to the inverse proportional relation between HRS and device size. The device performance can be improved by reducing surface roughness of source electrodes and optimizing fabrication process. The threshold switching mechanism is believed to be associated with the formation of unstable or even discontinuous conductive filaments at low compliance currents.

$I_D$-$V_{GS}$ transfer characteristics of the stand-alone AlGaN/GaN MIS-HEMTs were obtained at drain voltages ($V_{DS}$) from 3V to 9V and gate voltages ($V_{GS}$) from −14V to 4V and observed in both linear and logarithmic scales. The threshold voltage for HEMT ($V_{th}$), defined as the voltage at a current of $10^{-2}$ µA/µm, was determined as −12.28 V at a $V_{DS}$ of 6 V in the forward scan. In addition, the hysteresis of $V_{th}$ values between forward and backward scans was also obtained. The hysteresis of $V_{th}$ ($\Delta V_{th}$) is defined by the following equation: $\Delta V_{th} = V_{th}$ (backward)$-V_{th}$ (forward). The $\Delta V_{th}$ can originate from the acceptor-like trap states in the $Si_3N_4$/GaN interface. At $V_{DS}=6$ V, a low $\Delta V_{th}$ of 0.22 V was observed due to a high quality interface between GaN and $Si_3N_4$ grown by LPCVD. A tendency of hysteresis $\Delta V_{th}$ to decrease $V_{DS}$ increases was noted. This can be attributed at least in part to the fact that fewer electrons would be captured by those aforementioned trap states when $V_{DS}$ increases and then the electrical stress between gate and drain ($V_{GD}$) reduces. The saturation drain current ($I_D$) at $V_{GS}=4V$ and $V_{DS}=9V$ was 515 µA/µm. The ON/OFF ratio of over $10^7$ was also achieved in this stand-alone AlGaN MIS-HEMT device.

$I_D$-$V_{GS}$ transfer characteristics of integrated SS-HEMTs were obtained at $V_{DS}$ from 5V to 10V for both forward scans and backward scans in logarithmic scales. The steep-subthreshold-switching behaviors were clearly observed in both scan directions. This steep slope switching occurs at a huge current range from ~$10^{-5}$ µA/µm to more than $10^2$ µA/µm, indicating a high ON/OFF ratio of more than $10^7$. All subthreshold-switching values are below 5 mV/dec. In addition, the drain current ($I_D$) was suppressed in the SS-HEMT compared to the stand-alone MIS-HEMT. This can be attributed at least in part to the additional source resistance from the $SiO_2$-based threshold switching devices, leading to the reduction of the actual bias applied on the drain and thus the decrease of the drain current. For instance, at $V_{GS}=3V$ and $V_{DS}=9V$, the drain current was 432 µA/µm for SS-HEMT device while it was 513 µA/µm for the stand-alone MIS-HEMT.

The extracted subthreshold swing (SS) was observed as a function of the drain current for the integrated SS-HEMTs at $V_{DS}=5$ V, 6V, 7V, 8V, 9V, and 10V, respectively, in both scan directions. The extracted subthreshold swing (SS) was observed as a function of the drain current for the stand-alone AlGaN/GaN MIS-HEMTs at $V_{DS}=6V$. For the MIS-HEMT device, the SS values were higher than the Boltzmann limit of 60 mV/dec at RT, and the minimum values were ~85 mV/dec in the forward scan and ~80 mV/dec in the backward scan, respectively. With the integration of silica-based threshold switching devices, the steep subthreshold switching occurs at an abrupt transition range of drain current, which is higher than 5 orders of magnitude in forward scans. In addition, $V_{th}$ shifted to a less negative range observed in both scan directions. Starting from $V_{DS}=5$ V, the SS-HEMT exhibited the steep-subthreshold-switching behavior and dropped dramatically to 1.94 mV/dec, 1.79 mV/dec, 1.47 mV/dec, 1.47 mV/dec, 1.40 mV/dec and 4.07 mV/dec at $V_{DS}=5$ V, 6 V, 7 V, 8 V, 9 V and 10 V in the forward scans. In backward scans, SS values were still smaller than the Boltzmann limit of 60 mV/dec at RT, i.e., 1.81 mV/dec, 1.49 mV/dec, 2.96 mV/dec, 2.04 mV/dec, 2.02 mV/dec and 1.90 mV/dec at $V_{DS}=5$ V, 6V, 7V, 8V, 9V and 10V, respectively. In the steep-slope ranges, SS values are comparable in both scan directions. However, this is not a general case for measurement results of more than 50 times. SS values in backward scans are generally larger than in the forward scans. This can be attributed at least in part to the fact that more electrons are accumulated in the $SiO_2$-based threshold switching devices during sweeping of $V_{GS}$ from negative to positive range.

Figure 2B:
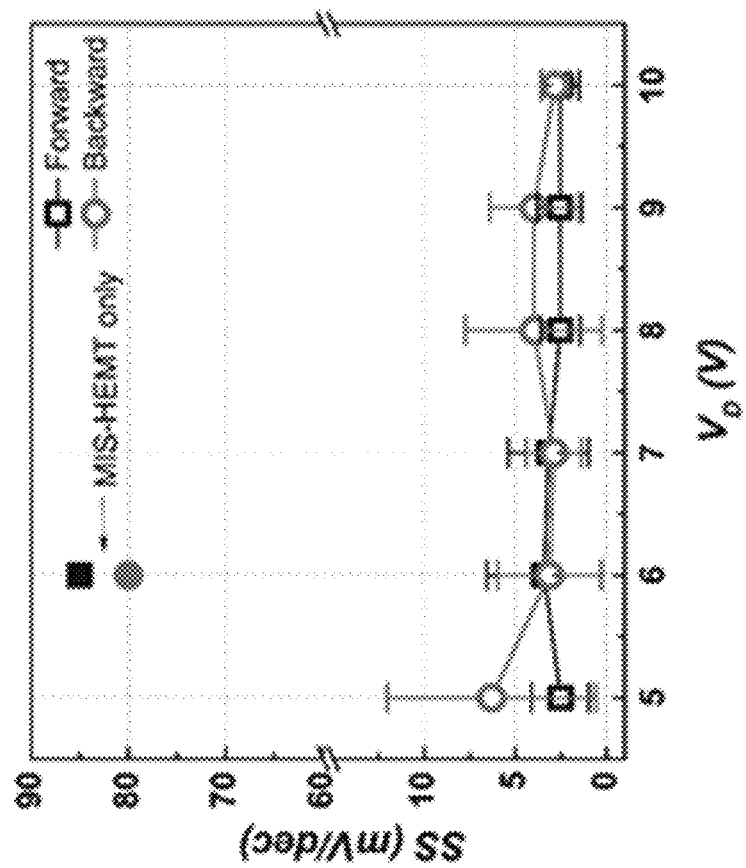
FIG. 2B shows a summary of SS values at a function of applied drain voltages $V_{DS}$ of the SS-HEMT. SS values of the stand-alone HEMT at $V_{DS}$=6V are also plotted for reference.
Figure 2A:
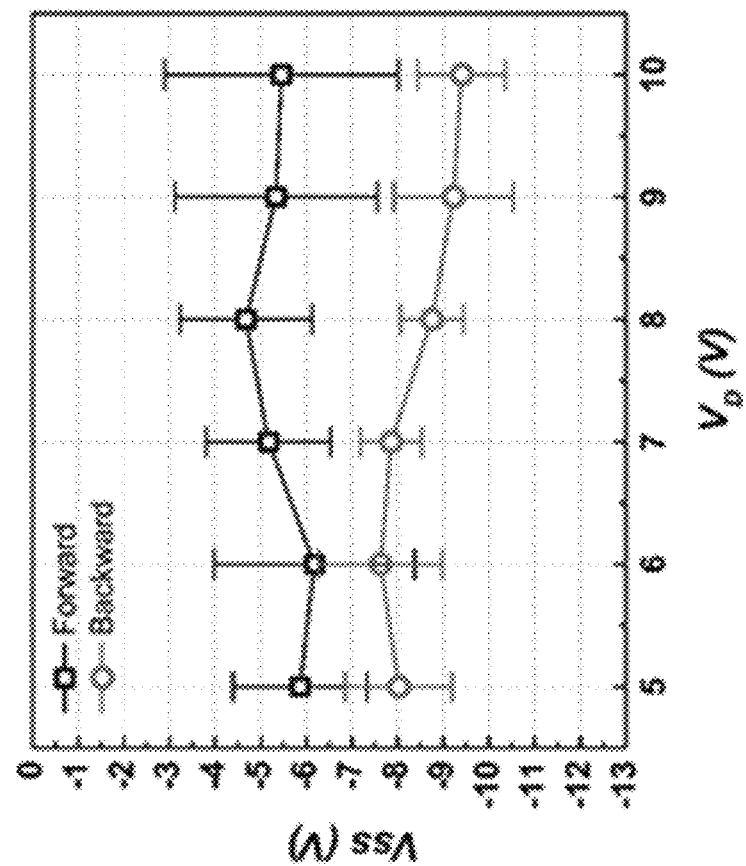
FIG. 2A shows a summary of $V_{SS}$ values (defined as the voltage where the steep slope transition occurs) at a function of applied drain voltages $V_{DS}$ of the SS-HEMT.

To confirm the repeatability of the steep-slope HEMT device, $I_{DS}$-$V_{GS}$ measurements were performed on multiple devices more than 50 times. Summary of $V_{SS}$ values (defined as the gate voltage where the steep slope transition occurs) at a function of applied drain voltages $V_{DS}$ in the SS-HEMT and the summary of SS values at a function of applied drain voltages $V_{DS}$ are shown in FIGS. 2A and 2B, respectively. For each sweep direction of each drain voltage $V_{DS}$, more than 10 $I_{DS}$-$V_{GS}$ curves were chosen to calculate the statistical distribution of $V_{SS}$ and SS values. All subthreshold gate voltages where the steep slope transition occurs ($V_{SS}$) are larger than (smaller in magnitude) that in a normal stand-alone HEMT device (~−12.5 V). In addition, $V_{SS}$ in backward scans are generally more negative than these in forward scans. This can be accounted for by electron accumulation in both MIM and HEMT devices during sweeps. As for SS ranges shown in FIG. 2B, SS appears to be more stable at around 2 to 5 mV/dec as $V_{DS}$ increases.

The threshold switching mechanisms can be understood as follows: with the $SiO_2$ threshold switching device on the source of a HEMT, the original gate voltage $V_{GS}$ is composed of 2 parts: $V_{GS'}$ and $V_{SS}$ (see FIG. 1C). The $V_{SS}$ (<0V) is equal to the condition where the Ag electrode was applied a positive voltage, namely $V_{SS}$>0, since this is a depletion-mode HEMT and steep switching occurs at a negative $V_{GS}$.

When $V_{GS}$ is smaller than $V_{th}$ of HEMT [$V_{th}$(HEMT)~−12 V], the integrated HEMT behaves like a stand-alone HEMT and the device was turned off.

As $V_{th}$<$V_{GS}$<0, $V_{SS}$ will exceed the $V_{th}$ of the $SiO_2$ threshold switching device [$V_{th}$ (MIM)] at a certain level of $V_{GS}$. Then conductive filaments form between top and bottom electrodes. The MIM device turns to LRS and the steep switching occurs and the transistor (HEMT in this case) turns on. This is possible because the OFF current is in the range from $10^{-9}$ to $10^{-7}$ A for $SiO_2$ MIM structure, while the OFF current of HEMT is lower than $1 \times 10^{-8}$ A (the detection limit of the setup).

As $V_{GS}$ sweep back, $V_{SS}$ will exceed the $V_{th}$ (MIM) at another certain level of $V_{GS}$. Then conductive filaments break, the MIM device turns to HRS, the steep switching occurs, and the transistor turns off.

In summary, steep-slope (SS) transistors having $SiO_2$-based threshold switching devices with AlGaN/GaN metal-insulator-semiconductor high electron mobility transistors (MIS-HEMTs) on Si substrates were disclosed. This integrated SS-HEMT device achieved 5 mV/dec subthreshold swing with a current transition range of over $10^5$ in the transfer characteristics in both scan directions at RT. It also demonstrated low leakage current (~$10^{-5}$ µA/µm) and a high $I_{ON}/I_{OFF}$ ratio (>$10^7$). Furthermore, the steep-subthreshold-switching behavior is independent on the applied drain voltage. Further engineering approaches can be adopted to fabricate the steep-slope transistor with desired switching behavior. For example, an enhancement-mode GaN HEMT, III-V transistors and even Si FinFETs can also be integrated with such $SiO_2$-based threshold switching devices. In addition, OFF current level can be further reduced by laterally scaling down the size of MIM structure. Therefore this transistor design harnesses the unique properties of facile and CMOS-compatible $SiO_2$-based threshold switching devices and provides performance advantages over conventional three-terminal transistors.

Although this disclosure contains many specific embodiment details, these should not be construed as limitations on the scope of the subject matter or on the scope of what may be claimed, but rather as descriptions of features that may be specific to particular embodiments. Certain features that are described in this disclosure in the context of separate embodiments can also be implemented, in combination, in a single embodiment. Conversely, various features that are described in the context of a single embodiment can also be implemented in multiple embodiments, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular embodiments of the subject matter have been described. Other embodiments, alterations, and permutations of the described embodiments are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results.

Accordingly, the previously described example embodiments do not define or constrain this disclosure. Other changes, substitutions, and alterations are also possible without departing from the spirit and scope of this disclosure.

What is claimed is:

1. A field effect transistor (FET) comprising:
   a source region and a drain region; and
   a threshold switching device in direct contact with the source region or the drain region,
   wherein the FET has a subthreshold swing of about 5 mV/dec with a transition range of over $10^5$ in both sweep directions at room temperature.

2. The FET of claim 1, wherein the FET is an AlGaN/GaN metal-insulator-semiconductor high electron mobility transistor (MIS-HEMT).

3. The FET of claim 1, wherein the threshold switching device has a metal-insulator-metal (MIM) structure comprising:
   a first electrode;
   a second electrode; and
   a threshold switching layer between the first electrode and the second electrode.

4. The FET of claim 3, wherein the first electrode comprises titanium.

5. The FET of claim 4, wherein the first electrode is in direct contact with the source region or the drain region.

6. The FET of claim 4, wherein the abrupt transition results in a steep threshold slope.

7. The FET of claim 3, wherein the second electrode comprises silver.

8. The FET of claim 3, wherein the threshold switching layer comprises $SiO_2$.

9. The FET of claim 1, wherein an abrupt transition from a high resistance state to a low resistance state occurs when an applied voltage reaches a threshold value.

10. The FET of claim 1, wherein the FET comprises Si, Ge, SiGe, or a binary or ternary compound semiconductor comprising elements from Groups II-VI, III-V, and IV-IV and Group III nitrides.

11. The FET of claim 1, wherein the FET has a leakage current of $10^{-5}$ μA/μm or less.

12. The FET of claim 1, wherein the FET has an on-to-off current ratio ($I_{ON}/I_{OFF}$) of greater than $10^7$.

13. The FET of claim 1, wherein the FET comprises:
   a silicon substrate;
   a GaN buffer layer on the Si substrate;
   a GaN channel layer on the GaN buffer layer;
   an AlN interlayer;
   a barrier layer comprising Al, Ga, and N; and
   a GaN cap layer.

14. A method of fabricating the field effect transistor (FET) of claim 1, the method comprising:
   depositing a first electrode layer directly on the source region or the drain region;
   depositing a threshold switching layer directly on the first electrode layer to yield the threshold switching device; and
   depositing a second electrode layer directly on the threshold switching layer to yield the FET.

15. The method of claim 14, wherein the first electrode layer comprises titanium.

16. The method of claim 14, wherein the second electrode layer comprises silver.

17. The method of claim 14, wherein the threshold switching layer comprises $SiO_2$.

* * * * *